US009435521B2

(12) United States Patent
Chen et al.

(10) Patent No.: US 9,435,521 B2
(45) Date of Patent: Sep. 6, 2016

(54) ANTENNA ELEMENT FOR A DIRECTIONAL LIGHTING FIXTURE

(71) Applicants: Timothy Chen, Aurora, OH (US); Donald A. Sargent, Wickliffe, OH (US)

(72) Inventors: Timothy Chen, Aurora, OH (US); Donald A. Sargent, Wickliffe, OH (US)

(73) Assignee: TECHNICAL CONSUMER PRODUCTS, INC., Aurora, OH (US)

(*) Notice: Subject to any disclaimer, the term of this patent is extended or adjusted under 35 U.S.C. 154(b) by 195 days.

(21) Appl. No.: 14/283,719

(22) Filed: May 21, 2014

(65) Prior Publication Data

US 2015/0338074 A1   Nov. 26, 2015

(51) Int. Cl.

| F21V 29/00 | (2015.01) |
| F21V 23/00 | (2015.01) |
| F21V 29/50 | (2015.01) |
| F21K 99/00 | (2016.01) |
| H01L 33/60 | (2010.01) |
| F21V 23/04 | (2006.01) |
| F21Y 101/02 | (2006.01) |

(52) U.S. Cl.
CPC .............. *F21V 23/006* (2013.01); *F21K 9/135* (2013.01); *F21K 9/1375* (2013.01); *F21V 23/045* (2013.01); *F21V 23/0435* (2013.01); *F21V 29/50* (2015.01); *H01L 33/60* (2013.01); *F21Y 2101/02* (2013.01); *Y10T 29/49119* (2015.01)

(58) Field of Classification Search
CPC ...... F21V 23/006; F21V 29/50; F21K 9/135; F21Y 2101/02; Y10T 29/49119

USPC .......... 362/548, 311.01, 311.02, 294; 315/34
See application file for complete search history.

(56) References Cited

U.S. PATENT DOCUMENTS

| 9,332,621 | B2* | 5/2016 | Sagal ................. H05B 37/0272 |
| 2007/0013557 | A1 | 1/2007 | Wang et al. |
| 2009/0279310 | A1 | 11/2009 | Freeman et al. |
| 2012/0274208 | A1 | 11/2012 | Chen et al. |
| 2013/0181607 | A1 | 7/2013 | Yotsumoto et al. |
| 2013/0271997 | A1 | 10/2013 | Kim et al. |
| 2014/0021862 | A1 | 1/2014 | Chung |
| 2014/0375204 | A1* | 12/2014 | Dai ..................... H05B 33/0803 315/34 |

OTHER PUBLICATIONS

PCT, International Search Report and Written Opinion; Patent Application No. PCT/US15/30726 (Aug. 12, 2015).

* cited by examiner

*Primary Examiner* — Anh Mai
*Assistant Examiner* — Glenn Zimmerman
(74) *Attorney, Agent, or Firm* — Thompson Hine LLP

(57) ABSTRACT

A directional lighting fixture is disclosed. The directional lighting fixture includes a first housing, a lighting element, an optical element, and a driver board. The lighting element is located within the first housing and substantially aligned with a central axis of the directional lighting fixture. The lighting element is configured to generate visible light. The optical element is positioned directly in front of the lighting element. The optical element is configured to direct the visible light generated by the lighting element in a specific direction. The driver board is electrically coupled to the lighting element and includes an antenna element. The driver board is offset from the central axis of the directional lighting fixture. The antenna element is positioned to be at least flush with the lighting element.

17 Claims, 9 Drawing Sheets

ANTENNA ELEMENT FOR A DIRECTIONAL LIGHTING FIXTURE

TECHNICAL FIELD

The present disclosure relates generally to an antenna element for directional lighting fixtures and more particularly to a directional lighting fixture utilizing an antenna element that is offset from a central axis and is positioned at least flush with a lighting element that generates visible light.

BACKGROUND

Wireless lighting control systems may utilize radio frequency (RF) communication to communicate control signals to an antenna element that is mounted on a driver board of a light fixture. For example, a user may turn on, turn off, or dim a light using wireless control. However, sometimes light fixtures include a housing that is constructed of a metallic material. The antenna element may be placed within or enclosed by the metallic housing. Thus, the metallic housing may act as an RF shield, which effectively blocks RF signals from reaching the antenna element. As a result, it may be difficult to wirelessly control the light, since the metallic housing significantly reduces the ability of RF signals to reach the antenna element.

Directional lamps may be defined as any type of lamp that transmits visible light in a specific direction. While an omnidirectional lamp may provide generally even, overall illumination, a directional lamp is typically used to highlight a specific object or area. For example, directional lamps may be used to highlight focal points such as paintings, sculptures, or architectural features within a space. Directional lamps typically include an optical element that is positioned directly in front of a light generating element. The light generating element may be any type of device for generating visible light such as, for example, a light emitting diode (LED) or a filament of an incandescent light. The optical element may be used to direct the visible light in a specific direction, and controls a beam angle and light distribution of the directional lamp.

It may be especially challenging to package the driver board, which includes the antenna element, within a directional light. This is because the optical element creates further packaging restraints. Specifically, the driver board should not substantially obstruct or interfere with the visible light reflected by the optic element.

SUMMARY

In one embodiment, a directional lighting fixture is disclosed. The directional lighting fixture includes a first housing, a lighting element, an optical element and a driver board. The lighting element is located within the first housing and is substantially aligned with a central axis of the directional lighting fixture. The lighting element is configured to generate visible light. The optical element is positioned directly in front of the lighting element. The optical element is configured to direct the visible light generated by the lighting element in a specific direction. The driver board is electrically coupled to the lighting element and includes an antenna element. The driver board is offset from the central axis of the directional lighting fixture. The antenna element is positioned to be at least flush with the lighting element.

In one embodiment, the driver board is positioned at a vertical angle with respect to the central axis of the directional lighting fixture. Alternatively, in another embodiment the driver board is substantially parallel with the central axis of the directional lighting fixture. In one embodiment, the first housing is constructed from a heat-conducting metal.

In another embodiment, a method for assembling a first housing, a second housing, and a driver board of a directional lighting fixture to one another is disclosed. The method includes installing the driver board to the second housing. The method further includes retaining the driver board in place within the second housing. Finally, the method includes installing the first housing to the second housing after the driver board is retained in place within the second housing. In one embodiment, the first housing includes a cutout and the second housing includes a projection. The first housing is installed to the second housing by receiving the projection of the second housing by the cutout of the first housing. In an embodiment, the driver board is retained within the second housing by either a potting material or a mechanical connection.

DETAILED DESCRIPTION

Figure 1:
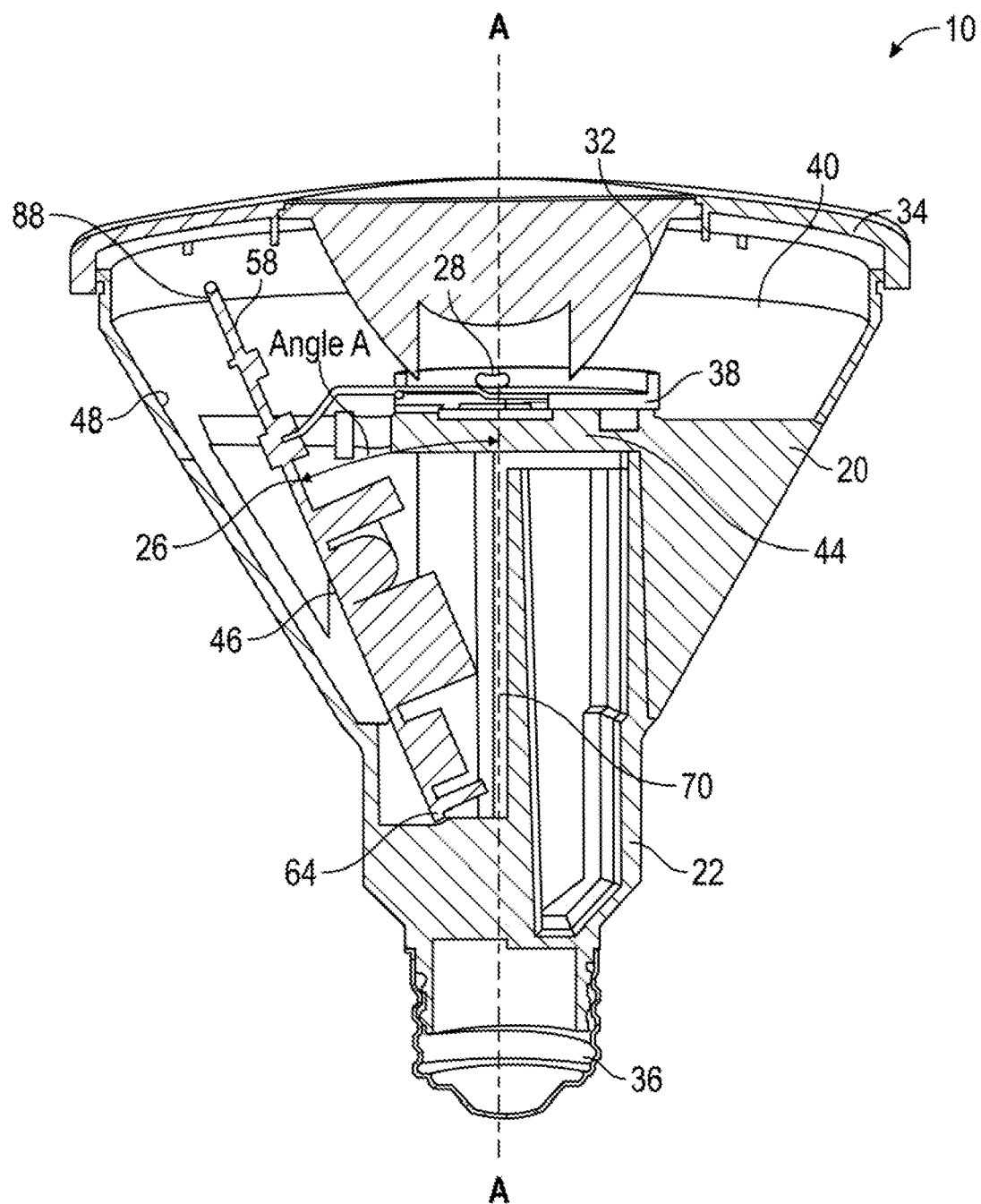
FIG. 1 is a cross-sectional view of an exemplary directional lighting fixture including a driver board, a first housing, and a second housing.

The following detailed description will illustrate the general principles of the invention, examples of which are additionally illustrated in the accompanying drawings. In the drawings, like reference numbers indicate identical or functionally similar elements.

FIG. 1 is a cross-sectioned view of an exemplary directional lighting fixture 10. The lighting fixture 10 may include a first housing 20, a sleeve or second housing 22, a driver board 26, a lighting element 28, an optic element 32, a lighting cover 34, and a socket base 36. As seen in FIG. 1, the lighting element 28 may be positioned centrally within the directional lighting fixture 10. Specifically, the lighting element 28 may be substantially aligned with a central axis A-A of the directional lighting fixture 10 such that the lighting element 28 is positioned at the center of the directional lighting fixture 10.

FIG. 1 illustrates the lighting element 28 as a single light emitting diode (LED) positioned along a board 38. However those skilled in the art will appreciate that the lighting element 28 may be multiple LEDs. Moreover, although an LED is illustrated, it is to be understood that the lighting element 28 may be any type of device that generates visible light such as, for example, a filament of an incandescent light. Specifically, the directional lighting fixture 10 may be any type of directional lamp for emitting visible light in a specific direction such as, but not limited to, an LED lamp, an incandescent lamp, a compact fluorescent lamp (CFL), or a gas-discharge lamp. Those skilled in the art will also appreciate that although the directional lighting fixture 10 is illustrated as a parabolic aluminized reflector (PAR) type lamp, the disclosure should not be limited to a PAR type lamp. Indeed, any type of directional lamp that is configured to transmit visible light in a specific direction may be used as well.

The optic element 32 may be positioned directly in front of the lighting element 28, along the central axis A-A of the directional lighting fixture 10. The optic element 32 may be any type of device that directs light generated by the lighting element 28 in a specific pattern or direction. Those skilled in the art will readily appreciate that generally all directional lamps employ an optical element to direct light in a specific direction. In one exemplary embodiment, the optic element 32 may be a collimator that is constructed of a substantially transparent or translucent material. For example, the optic element 32 may be constructed of a plastic material such as, for example, polycarbonate, or glass. In the embodiment as illustrated, the optic element 32 includes a generally parabolic configuration for directing visible light generated by the lighting element 28, however it is to be understood that the disclosure is not limited to a parabolic configuration.

In one non-limiting embodiment, the first housing 20 may be constructed of a heat-conducting metal such as, for example, aluminium or a metal alloy. Alternatively, in another embodiment, the first housing 20 may be constructed of a thermally conductive plastic. One commercially available example of a thermally conductive plastic is sold under the trade name THERMA-TECH™, and is available from the PolyOne Corporation of Avon Lake, Ohio. Referring to both FIGS. 1-2, the first housing 20 may include a plurality of fins 42 for dissipating heat as well as a ledge or shelf 44 for supporting the board 38 of the LED 28. In one exemplary embodiment, the fins 42 and the shelf 44 are both located within a cavity 40 of the first housing 20. The cavity 40 of the first housing 20 may contain the internal components of the directional lighting fixture 10 such as the driver board 26, the lighting element 28, and the optic element 32.

The second housing 22 may be constructed of any type of non-metallic material that allows for radio frequency (RF) signals to pass through such as, but not limited to, plastic. For example, in one embodiment, the second housing 22 may be constructed from acrylonitrile butadiene styrene (ABS). In particular, as seen in FIG. 1, a portion of a rear surface 46 of the driver board 26 may generally oppose an interior surface 48 of the second housing 22 when the directional lighting fixture 10 is assembled.

Figure 3:
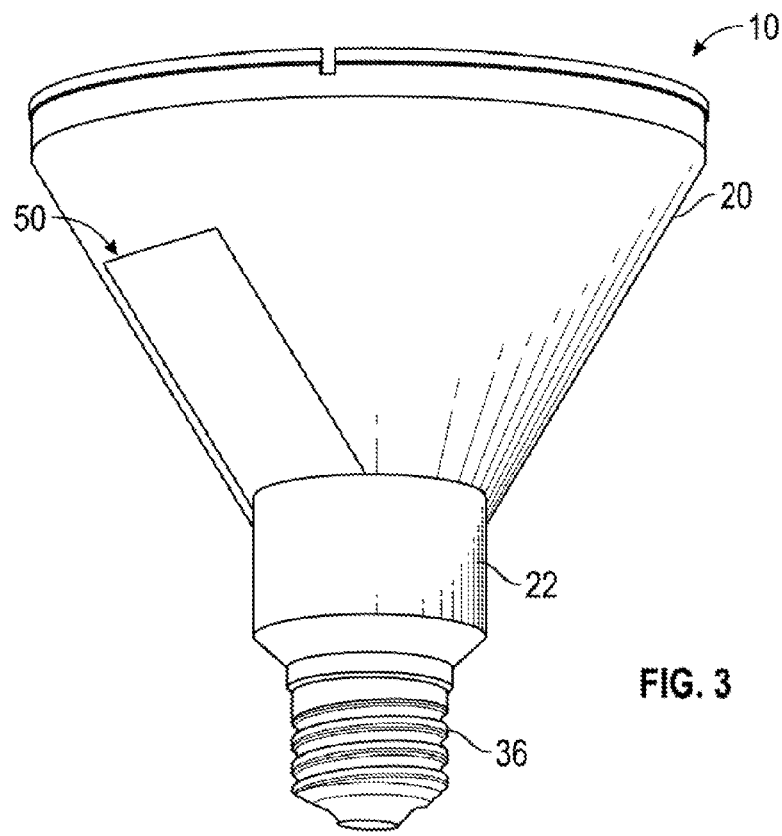
FIG. 3 is a perspective view of the light fixture shown in FIG. 1.

Referring to FIGS. 1 and 3, both the first housing 20 and the second housing 22 may include a keyed connection 50 between one another. The keyed connection 50, which is described in greater detail below, generally prevents relative rotation between the first housing 20 and the second housing 22. Therefore, when the directional lighting fixture 10 is assembled, the rear surface 46 of the driver board 26 may always oppose the interior surface 48 of the second housing 22. This orientation allows for RF signals to easily reach an antenna element 56 (shown in FIG. 4), which is disposed along a front surface 58 of the driver board 26. Specifically, referring to FIG. 1, RF signals typically pass through the lighting cover 34 to reach the antenna element 56 (shown in FIG. 4). This approach for RF signal communication is generally used in most types of directional lights today. However, because the second housing 22 is constructed of a material that allows for RF signals to pass through, a second pathway for RF signals to reach the antenna element 56 is created. As a result, in some embodiments the driver board 26 may be positioned further away from the lighting cover 34 when compared to a directional light that does not include a second pathway for RF signals to reach an antenna element. In other words, some types of lamps currently available that do not include a second pathway for RF signals to reach an antenna element may include a driver board that protrudes upwardly, towards the lighting cover. In contrast, the disclosed antenna element 56 does not necessarily need to receive RF communication through the lighting cover 34. Therefore, the disclosed driver board 26 does not need to protrude as far upwardly towards the lighting cover 34 as a traditional lamp.

Figure 4:
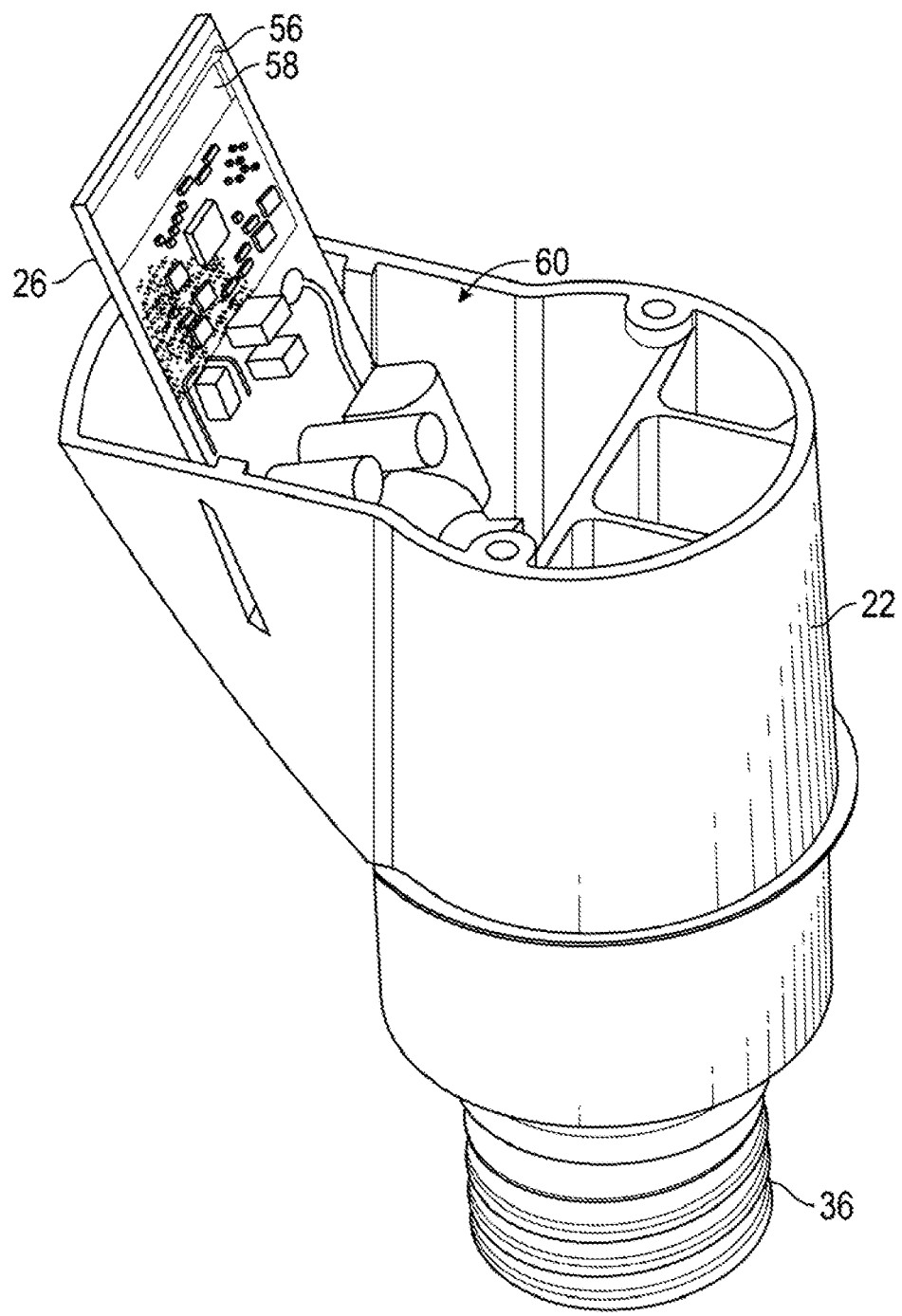
FIG. 4 is an illustration of the second housing and the driver board of the light fixture shown in FIG. 1.

Referring to FIG. 4, in one embodiment the driver board 26 may be a printed circuit board (PCB) and the antenna element 56 may be a trace antenna. However, those skilled in the art will appreciate that the disclosure should not be limited to a trace antenna and PCB. In one embodiment, the antenna element 56 may be configured to receive a short-range RF signal such as, for example, a Bluetooth® signal conforming to IEEE Standard 802.15. Moreover, although only one antenna element 56 is discussed, those skilled in the art will readily appreciate that more than one antenna element may also be included on the driver board 26 as well in order to receive RF signals of varying frequencies. Alternatively, in another embodiment, the antenna element 56 may be a multi-band antenna that operates at different RF frequency bands.

Figure 5:
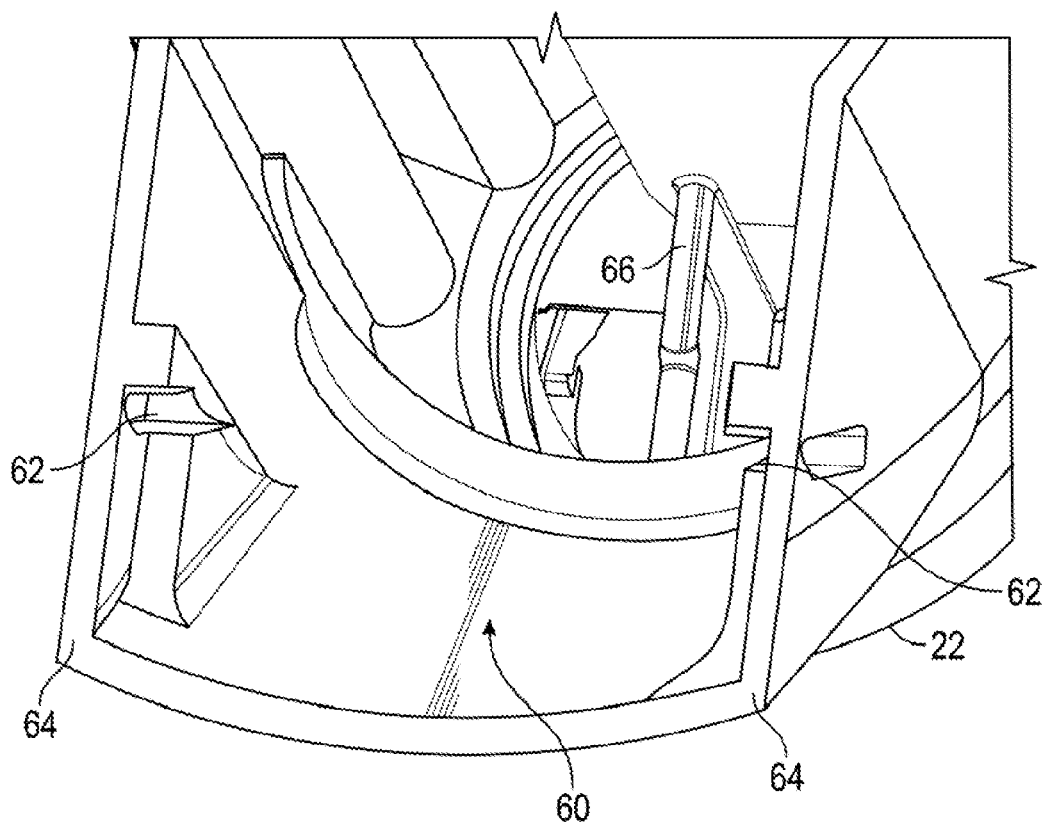
FIG. 5 is an enlarged view of an opening of the housing shown in FIG. 1.

FIG. 4 is an illustration of the second housing 22 and the driver board 26, where the driver board 26 has been assembled to the second housing 22. FIG. 5 is an enlarged view of a portion of an opening 60 of the second housing 22. As seen in FIG. 5, the second housing 22 may include two angled slots 62 located along opposing sides 64 of the opening 60 of the second housing 22. Referring to both FIGS. 4-5, in one embodiment the driver board 26 may be installed to the second housing 22 by sliding the driver board 26 into the opening 60 of the second housing 22 along the two angled slots 62. Specifically, an operator may slide the driver board 26 into the opening 60 of the second housing 22 until a bottom end 64 (seen in FIG. 1) of the driver board 26 abuts against a rib 66 positioned within the second housing 22. After the socket base 36 has been installed to the second housing 22, potting material (not illustrated in the figures) may be placed within a cavity 70 of the second housing 22 (shown in FIG. 1). The potting may be used to retain the driver board 26 in place within the second housing 22. In an alternative embodiment, the potting material may be omitted, and instead the driver board 26 may be held in place by a mechanical connection. For example, in one embodiment, the driver board may be attached to the first housing 20 using a fastener such as, but not limited to, a screw, clip, or a locking feature.

Figure 6:
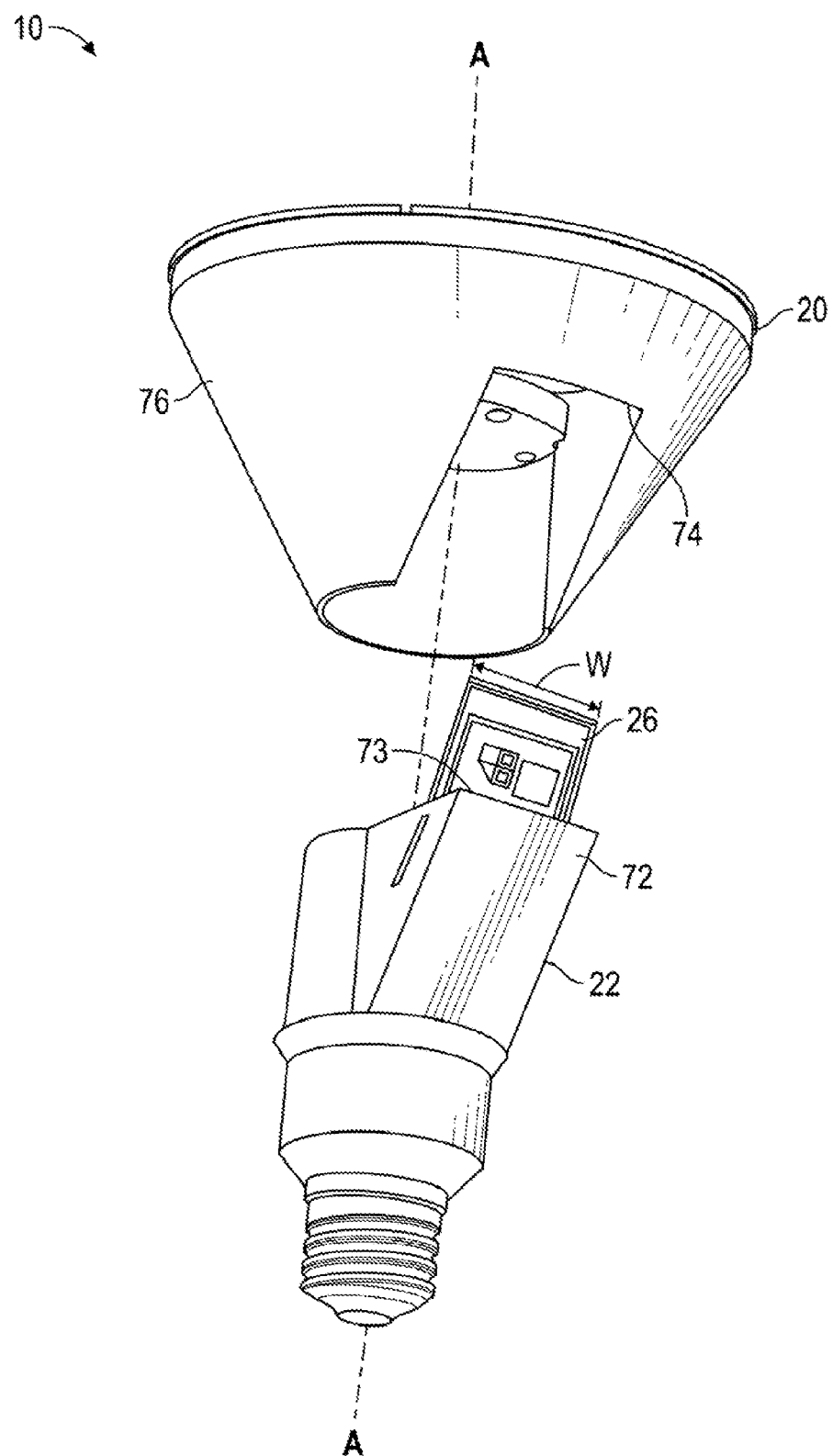
FIG. 6 is a partially exploded view of the light fixture shown in FIG. 1.

FIG. 6 illustrates the second housing 22 and the driver board 26 assembled to one another, but before being installed to the first housing 20. As seen in FIG. 6, the second housing 22 includes a projection 72 that is radially offset from the central axis A-A of the directional lighting fixture 10. In the non-limiting embodiment as shown, the projection 72 is shaped to generally correspond with a width W of the driver board 26. However, as seen in FIG. 6, the driver board 26 may project or extend upwardly in a vertical direction past an uppermost edge 73 of the projection 72.

In one embodiment, the driver board 26 may be positioned within the second housing 22 at a vertical angle A (seen in FIG. 1) with respect to the central axis A-A of the directional lighting fixture 10. In the non-limiting embodiment as shown in FIG. 1, the vertical angle A may be about thirty degrees, however, those skilled in the art will appreciate that other angles may be used as well. Specifically, the driver board 26 may be angled at any orientation possible so long as the driver board 26 does not interfere with the packaging restraints of the directional light fixture 10. Moreover, although the figures illustrate the driver board 26 positioned at the vertical angle A, it is to be understood that in another approach, the driver board 26 may be positioned substantially parallel with the central axis A-A of the directional lighting fixture 10.

Turning back to FIG. 6, the first housing 20 may define an opening or cutout 74. The cutout 74 is defined by an exterior wall 76 of the first housing 20. The cutout 74 is shaped to generally correspond with the projection 72 of the second housing 22. During assembly of the directional lighting fixture 10, the second housing 22 and the driver board 26 are first assembled to one another. Then the first housing 20 is placed over the second housing 22 such that the projection 72 is received by the cutout 74 of the first housing 20. Thus, the keyed connection 50 (which is shown in FIG. 4), may be defined by the projection 72 of the second housing 22 and the cutout 74 of the first housing 20. Those skilled in the art will readily appreciate that although the projection 72 of the second housing 22 and the cutout 74 of the first housing 20 both include a generally rectangular profile, these elements may include any type of profile available so long as the cutout 74 of the first housing 20 is shaped to generally correspond with and receive the projection 72 of the second housing 22, without any substantial gaps or holes.

Figure 2:
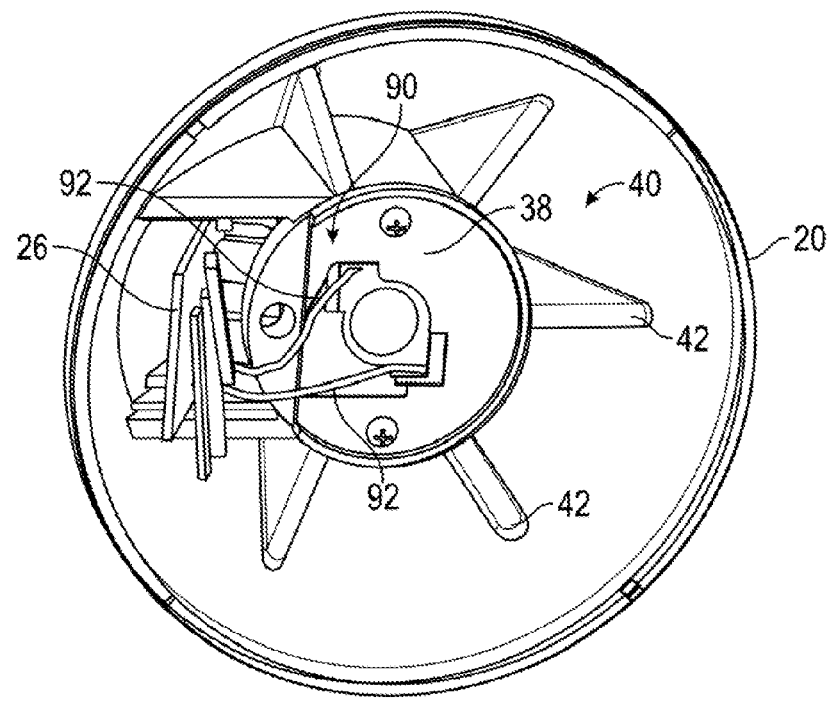
FIG. 2 is downwards view of the light fixture shown in FIG. 1.
Figure 7:
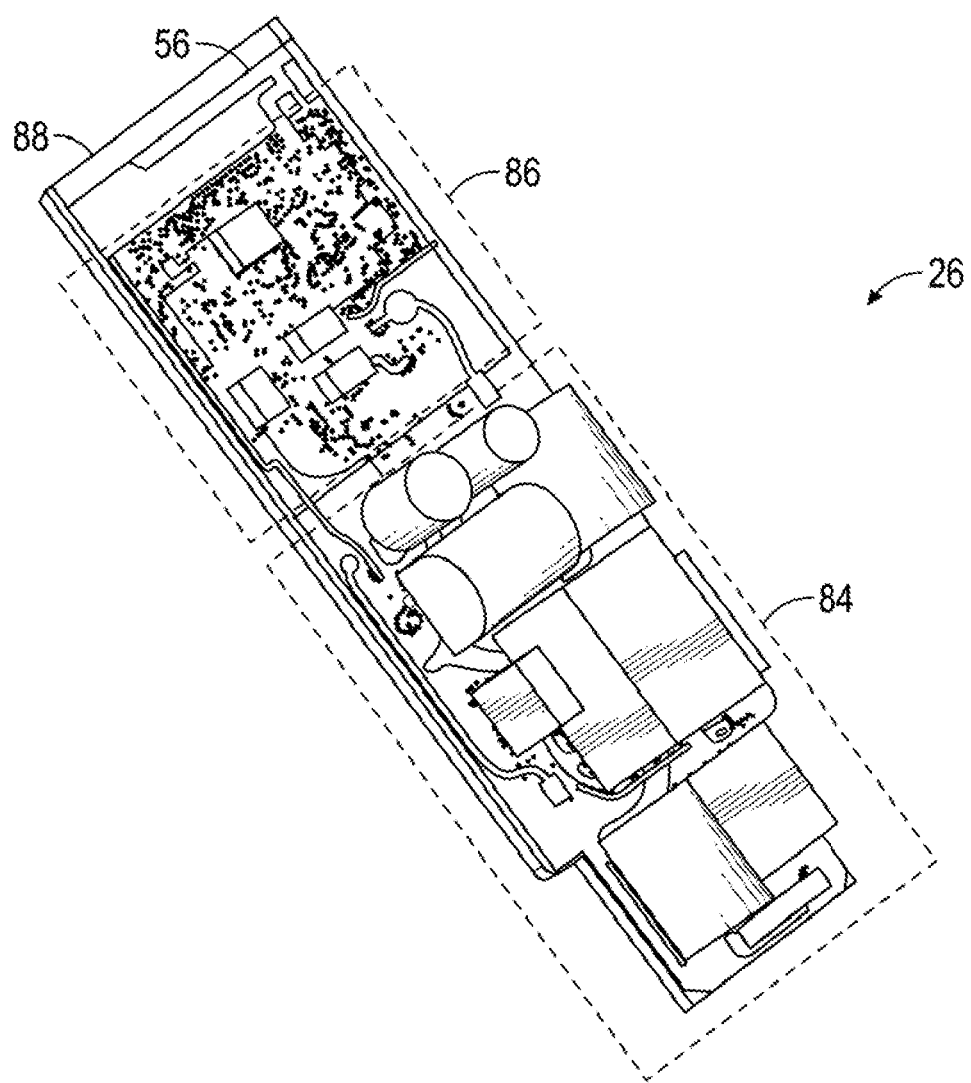
FIG. 7 is an illustration of the driver board of the light fixture shown in FIG. 1.

FIG. 7 is an illustration of the driver board 26. The driver board 26 may include various power electronics 84 and RF electronics 86. In one embodiment, the driver board 26 may be a PCB. The antenna element 56 may be positioned along an upper end 88 of the driver board 26. As seen in FIG. 2, the driver board 26 is electrically connected to and delivers power to the lighting element 28 through a wired connection 90. In particular, wires 92 of the driver board 26 may be soldered to the lighting element 28. The wires 92 deliver the necessary power to illuminate the lighting element 28.

Referring to both FIGS. 1 and 7, when the driver board 26 is installed to the directional lighting fixture 10, the antenna element 56 located along upper end 88 of the driver board 26 may be positioned at least flush with the lighting element 28 in a vertical direction. In particular, the height of the driver board 26 should be at least a minimum height so that the upper end 88 and the antenna element 56 may be positioned at least flush with the lighting element 28, and is not recessed within the first housing 20. However, it should also be noted that the height of the driver board 26 should not be so tall as to create an interference with the lighting cover 34. Thus, the antenna element 56 is positioned within the directional lighting fixture 10 so that if the first housing 20 is constructed of a material that effectively blocks RF signals (e.g., aluminium), the antenna element 56 is still oriented outwardly and towards the lighting cover 34. Therefore, the antenna element 56 may not be encompassed within the first housing 20, and is able to receive RF signals more effectively compared with an antenna that is encompassed or buried within the first housing 20.

Continuing to refer to FIGS. 1 and 7, the driver board 26 should be oriented within the first housing 20 such that the antenna element 56 and the upper end 88 of the driver board 26 do not interfere or contact the optic element 32. Specifically, the driver board 26 should be offset from the central axis A-A of the directional lighting fixture 10 such that the driver board 26 does not substantially obstruct or interfere with the visible light reflected by the optic element 32.

Figure 8:
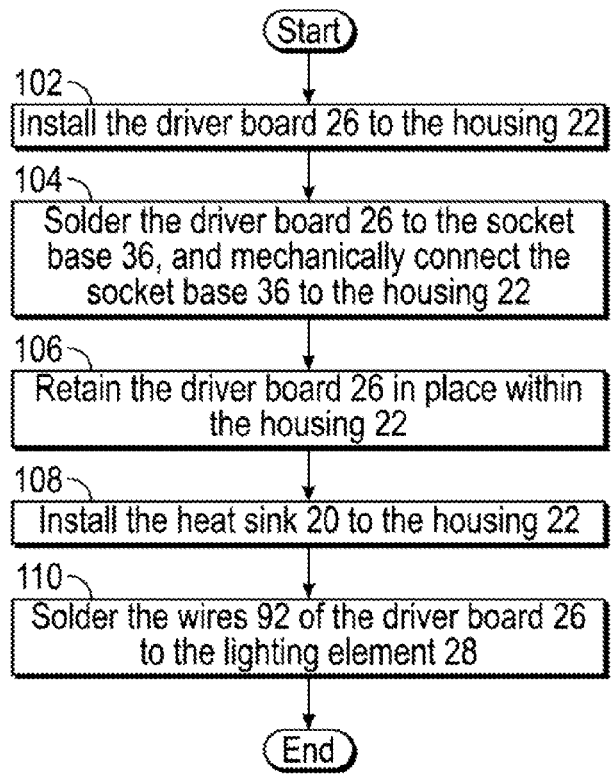
FIG. 8 is an exemplary process flow diagram illustrating a method of assembling the first housing, the second housing, and the driver board shown in FIG. 1 to one another.

FIG. 8 is a process flow diagram illustrating an exemplary method for assembling the first housing 20, the second housing 22, and the driver board 26 together. The illustrated process may provide an easier, more ergonomic approach for assembling the second housing 22 and the driver board 26 to one another. Referring generally to FIGS. 1-8, the method begins at block 102 where the driver board 26 is installed to the second housing 22. Specifically, the driver board 26 is slid into the opening 60 of the second housing 22 along the two angled slots 62 (shown in FIG. 5). An operator may slide the driver board 26 into the opening 60 of the second housing 22 until the bottom end 64 (seen in FIG. 1) of the driver board 26 abuts against the rib 66 positioned within the second housing 22. The method may then proceed to block 104.

In block 104, the driver board 26 may be soldered to the socket base 36. Specifically, the driver board 26 may include wiring (not illustrated in the figures) that is soldered to the socket base 36. The wiring is used to electrically connect the driver board 26 to the socket base 36. The socket base 36 may then be mechanically connected to the second housing 22. It is to be understood that soldering the driver board 26 to the socket base 36 before installing the first housing 20 (which is described below in block 108) may result in an easier, more ergonomic approach for assembling the driver board 26 to the second housing 22. This is because it is relatively easier for an operator to manipulate the second housing 22 without having the first housing 20 attached thereto. The method may then proceed to block 106.

In block 106, the driver board 26 may be retained in place within the second housing 22 by potting material or, alternatively, by a mechanical connection. The method may then proceed to block 108.

In block 108, the first housing 20 may be installed to the second housing 22. Specifically, the projection 72 of the first housing 20 may be received by the cutout 74 of the first housing 20. The method may then proceed to block 110.

In block 110, the driver board 26 is electrically connected to the lighting element 28 through a wired connection 90. In particular, wires 92 of the driver board 26 may be soldered to the lighting element 28. The method may then terminate.

Figure 9:
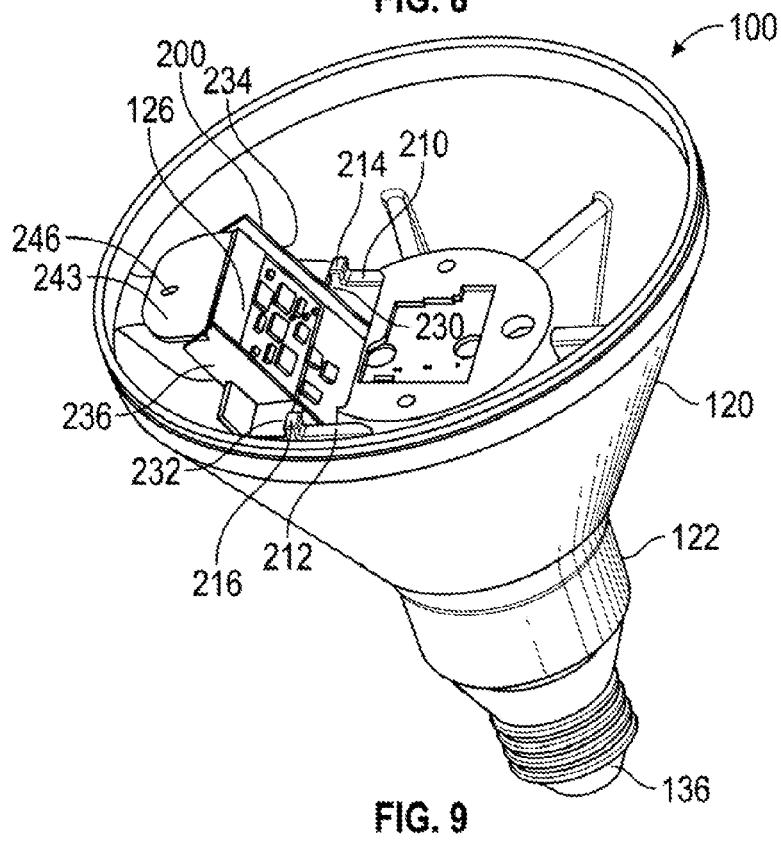
FIG. 9 is a perspective view of an alternative embodiment of a directional light fixture, where a driver board is mounted to a support.
Figure 10:
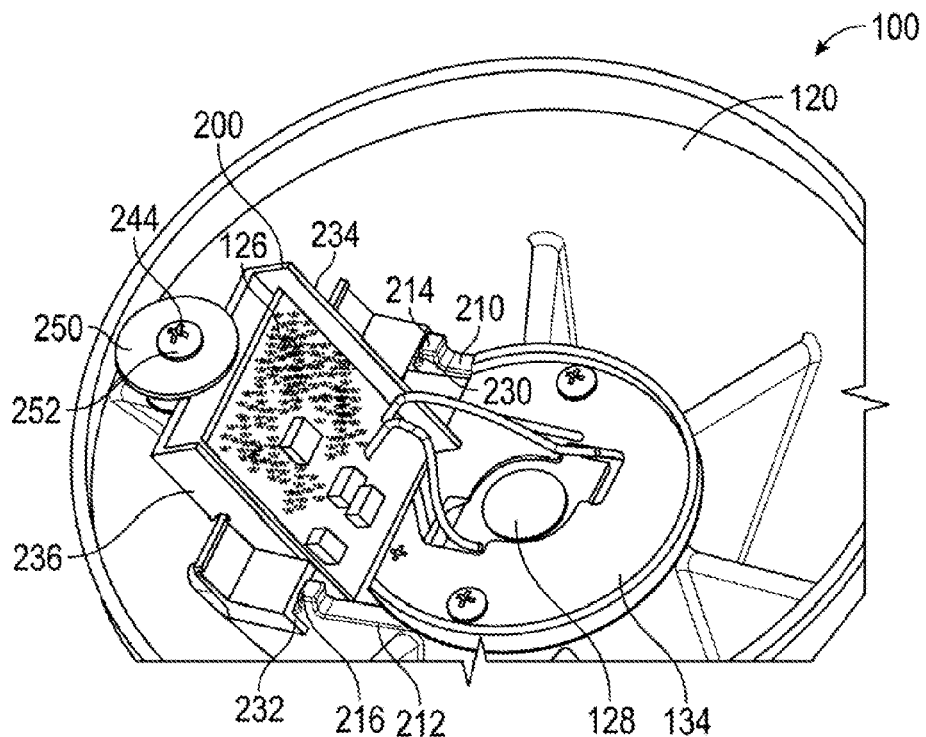
FIG. 10 is an enlarged, perspective view of the directional lighting fixture shown in FIG. 9.

FIGS. 9-10 illustrate an alternative embodiment of a directional lighting fixture 100. Similar to the embodiment as discussed above and shown in FIGS. 1-7, the lighting fixture 100 may include a first housing 120, a sleeve or second housing 122, a driver board 126, a lighting element 128, an optic element (not illustrated), a lighting cover (not illustrated), and a socket base 136. However, unlike the embodiment as described above and shown in FIGS. 1-7, the driver board 126 may be mounted to a coupon or support 200. The support 200 may be constructed of any type of non-metallic material that allows for RF signals to pass through, and is also rigid enough to provide mechanical support to position the driver board 126 within the first housing 120. For example, in one embodiment the support 200 may be constructed of a plastic material such as polypropylene (PP) or polyurethane.

Figure 11:
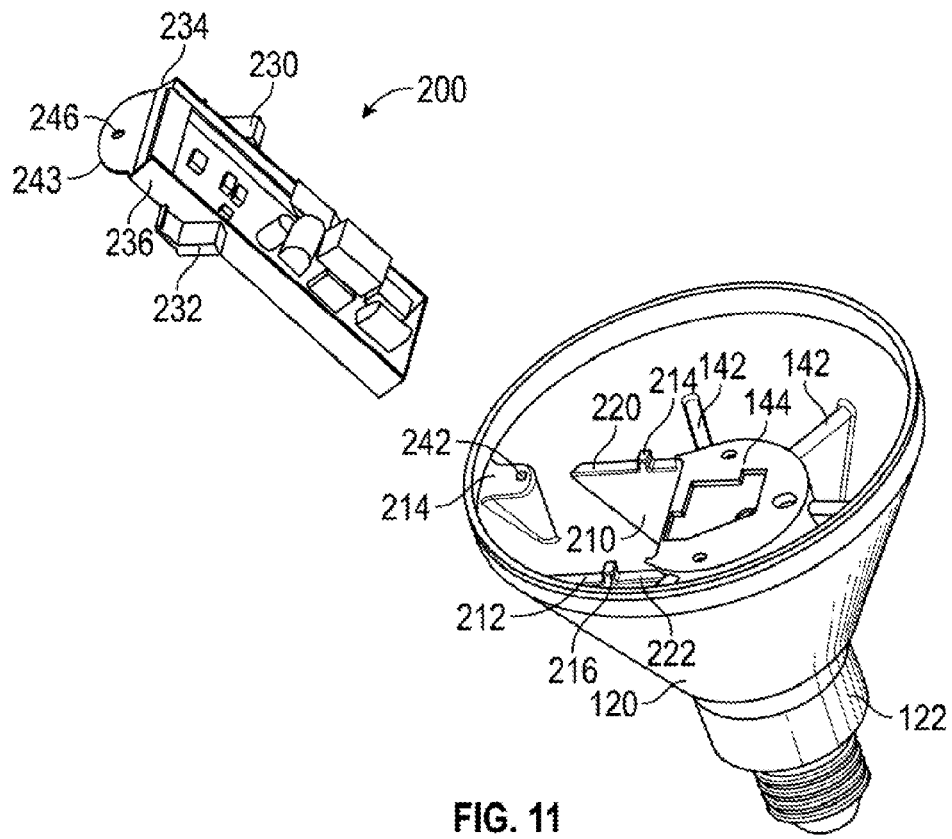
FIG. 11 is an assembly view of the directional lighting fixture shown in FIG. 9, prior to the driver board and the support being assembled to the directional lighting fixture.

FIG. 11 illustrates the first housing 120 assembled to the second housing 122, where the support 200 has not yet been installed to the first housing 120. Similar to the embodiment as shown in FIGS. 1-2, the first housing 120 may include a plurality of fins 142 for dissipating heat as well as a ledge or shield 144 for supporting a board 134 (FIG. 9) that the LED 128 is mounted upon. The first housing 120 may further include two mounting ribs 210, 212 that are positioned to be substantially parallel to one another, as well as a fastener mounting feature 214. The two mounting ribs 210, 212 may each include a raised projection 214, 216 located along upper edges 220, 222 of each of the mounting ribs 210, 212.

Referring to FIGS. 9-11, the support 200 may have two shoulders 230, 232 that are located on opposing sides 234, 236 of the support 200. As best seen in FIGS. 9-10, during assembly of the support 200 to the first housing 120, each shoulder 230, 232 receives and rests against one of the two mounting ribs 210, 212. The projections 214, 216 act as a stopper to orient the support 200 in place within the first housing 120. The fastener mounting feature 214 (FIG. 11) of the first housing 120 may include an aperture 242 for receiving a shank (not illustrated) of a fastening device 244 such as, for example, a screw. The support 200 may also include a projection 243 that defines an aperture 246 that also receives the shank of the fastening device 244. As seen in FIG. 10, a washer 250 may be placed between a head 252 of the fastening device 244 and the projection 242 of the support 200.

The fastening device 244 may be used to securely attach the support 200 to the first housing 120. The fastening device 244 also orients the support 200 at a vertical angle (not visible in the figures). Specifically, the fastening device 244 may be used to orient the support 200 and the driver board 126 at a vertical angle, similar to the vertical angle A as seen in FIG. 1. Those skilled in the art will readily appreciate that although FIG. 10 illustrates the fastening device 214 as a screw, any type of device such as, for example, a locking feature, a snap fit, or another feature may be used as well to secure the support 200 to the first housing 120.

Figure 12:
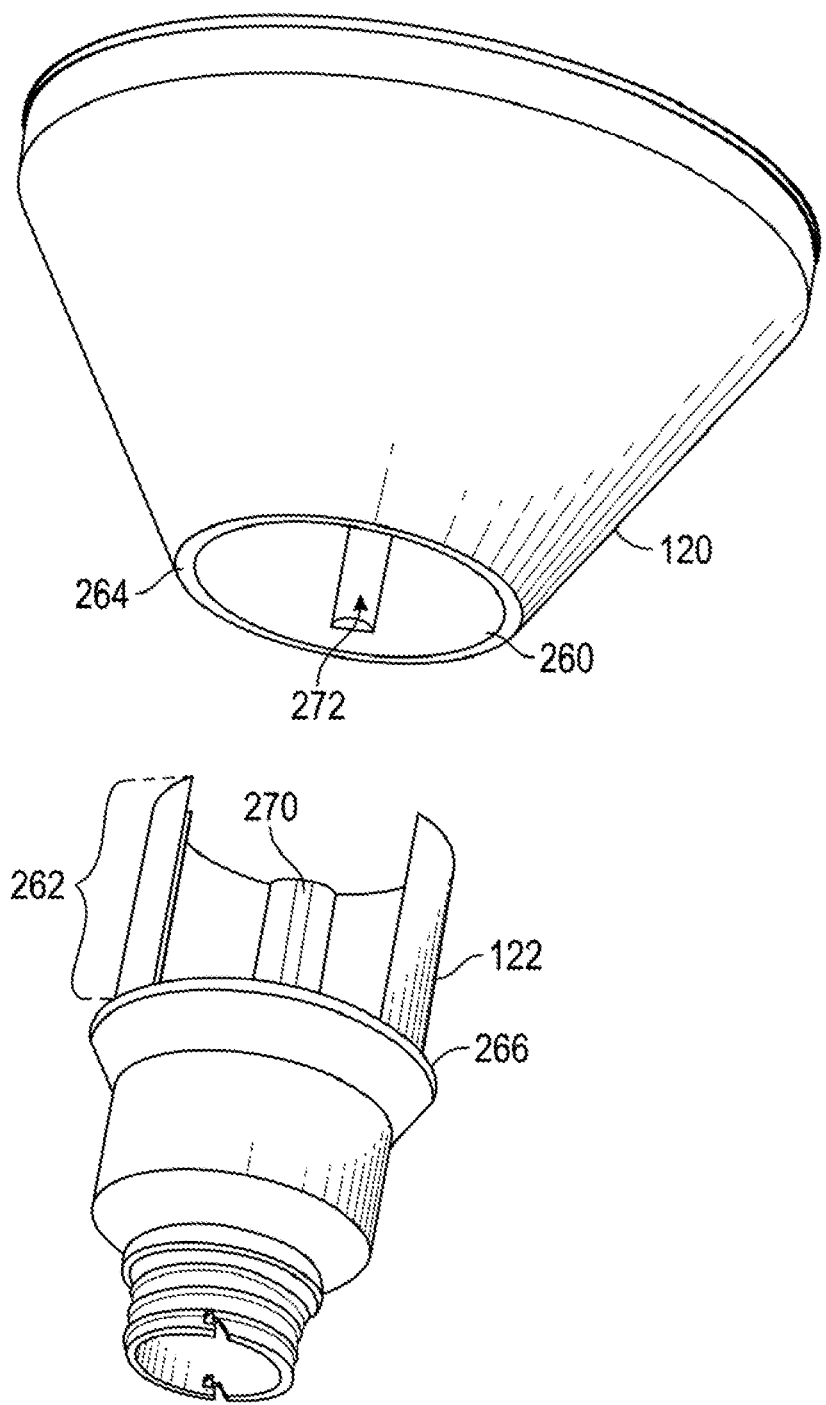
FIG. 12 is an illustration of the first housing and a second housing of the directional lighting fixture shown in FIG. 9, prior to being assembled to one another.

FIG. 12 is an exploded view of the first housing 120 and the second housing 122. The first housing 120 includes an opening 260 for receiving an upper portion 262 of the second housing 122. Specifically, the opening 260 of the first housing 120 defines a surface 264 that rests upon a ledge 266 of the second housing 122. The second housing 122 may also include a vertically oriented slot 270. The slot 270 is shaped to receive a mating portion 272 located within the first housing 120. The slot 270 may slidingly engage with the mating portion 272 of the first housing 120. Once the first housing 120 and the second housing 122 are assembled to one another, the first housing 120 is generally unable to rotate relative to the second housing 122. In the embodiment as shown in FIGS. 9-12, the first housing 120 and the second housing 122 are assembled to one another first. Then, the support 200 (FIGS. 9-11) may be installed to the first housing 120 as described above. Similar to the embodiment as shown in FIGS. 1-7, the driver board 126 may include wiring (not illustrated in the figures) that is soldered to the socket base 136 (FIG. 9).

Referring generally to the figures, the disclosed directional lighting fixtures 10, 100 may include improved RF reception when compared to some types of directional lights currently available. This is because the disclosed antenna element is positioned away from the first housing and towards the lighting cover. Thus, the disclosed antenna is able to receive RF signals more effectively when compared with an antenna that is encompassed or buried within the first housing. In addition to enhanced RF capabilities, the disclosed directional lighting fixture 10 as illustrated in FIGS. 1-7 may also be relatively easy and simple to assemble, especially when compared to some other types of lighting fixtures currently available.

While the forms of apparatus and methods herein described constitute preferred embodiments of this invention, it is to be understood that the invention is not limited to these precise forms of apparatus and methods, and the changes may be made therein without departing from the scope of the invention.

What is claimed is:

1. A directional lighting fixture, comprising:
    a first housing;
    a lighting element located within the first housing and substantially aligned with a central axis of the directional lighting fixture, the lighting element configured to generate visible light;
    an optical element positioned directly in front of the lighting element, the optical element configured to direct the visible light generated by the lighting element in a specific direction; and
    a driver board electrically coupled to the lighting element and including an antenna element, wherein the driver board is offset from the central axis of the directional lighting fixture, and wherein the antenna element is positioned to be at least flush with the lighting element.

2. The directional lighting fixture of claim 1, wherein the driver board is positioned at a vertical angle with respect to the central axis of the directional lighting fixture.

3. The directional lighting fixture of claim 1, wherein the driver board is substantially parallel with the central axis of the directional lighting fixture.

4. The directional lighting fixture of claim 1, wherein the first housing is constructed of a heat-conducting metal.

5. The directional lighting fixture of claim 1, wherein the lighting element is at least one LED.

6. The directional lighting fixture of claim 1, further comprising a second housing that is constructed of material that allows for radio frequency (RF) signals to pass through, wherein the first housing and the second housing are connected to one another by a keyed connection.

7. The directional lighting fixture of claim 1, further comprising a support constructed of a material that allows for RF signals to pass through, wherein the driver board is mounted to the support.

8. The directional lighting fixture of claim 1, wherein the directional lighting fixture is one of an LED lamp, an incandescent lamp, a compact fluorescent lamp (CFL), and a gas-discharge lamp.

9. The directional lighting fixture of claim 6, wherein the second housing includes a projection and the first housing defines a cutout that is shaped to generally correspond with the projection of the second housing to create the keyed connection.

10. The directional lighting fixture of claim 6, wherein the second housing includes an opening and two angled slots located along opposing sides of the opening of the second housing.

11. The directional lighting fixture of claim 7, wherein the support includes two shoulders that are located on opposing sides of the support.

12. The directional lighting fixture of claim 7, further comprising a fastening device that securely attaches the support to the first housing.

13. The directional lighting fixture of claim 10, wherein the driver board is configured to be installed to the second housing by sliding the driver board into the opening of the second housing along the two angled slots.

14. The directional lighting fixture of claim 11, wherein the first housing includes two mounting ribs, and wherein each shoulder of the support receives and rests against one of the two mounting ribs.

15. A directional lighting fixture, comprising:
a first housing constructed of a heat-conducting metal;
a lighting element located within the first housing and substantially aligned with a central axis of the directional lighting fixture, the lighting element configured to generate visible light;
an optical element positioned directly in front of the lighting element, the optical element configured to direct the visible light generated by the lighting element in a specific direction; and
a driver board positioned at a vertical angle with respect to the central axis of the directional lighting fixture, wherein the driver board is electrically coupled to the lighting element and includes an antenna element, and wherein the driver board is offset from the central axis of the directional lighting fixture, and wherein the antenna element is positioned to be at least flush with the lighting element.

16. The directional lighting fixture of claim 15, further comprising a second housing that is constructed of material that allows for radio frequency (RF) signals to pass through, wherein the first housing and the second housing are connected to one another by a keyed connection.

17. The directional lighting fixture of claim 15, further comprising a support constructed of a material that allows for RF signals to pass through, wherein the driver board is mounted to the support.

* * * * *